US012356761B2

(12) United States Patent
Pandey et al.

(10) Patent No.: US 12,356,761 B2
(45) Date of Patent: Jul. 8, 2025

(54) LIGHT EMITTING DEVICE

(71) Applicant: THE REGENTS OF THE UNIVERSITY OF MICHIGAN, Office of Technology Transfer, Ann Arbor, MI (US)

(72) Inventors: Ayush Pandey, Ann Arbor, MI (US); Zetian Mi, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 462 days.

(21) Appl. No.: 17/839,268

(22) Filed: Jun. 13, 2022

(65) Prior Publication Data
US 2024/0405160 A1 Dec. 5, 2024

Related U.S. Application Data

(60) Provisional application No. 63/210,440, filed on Jun. 14, 2021.

(51) Int. Cl.
H01L 33/24 (2010.01)
H10H 20/01 (2025.01)
(Continued)

(52) U.S. Cl.
CPC ...... *H10H 20/816* (2025.01); *H10H 20/0137* (2025.01); *H10H 20/812* (2025.01); *H10H 20/8215* (2025.01); *H10H 20/825* (2025.01)

(58) Field of Classification Search
CPC ..... H01L 33/14; H01L 33/0075; H01L 33/00; H01L 33/025; H01L 33/02; H01L 33/06; H01L 33/32; H10H 20/816; H10H 20/0137; H10H 20/01; H10H 20/812; H10H 20/8215; H10H 20/81; H10H 20/825

See application file for complete search history.

(56) References Cited

U.S. PATENT DOCUMENTS 10,923,620 B2 * 2/2021 Charles .................. H01L 33/06
10,957,817 B2 * 3/2021 Islam .................... H01L 33/325
(Continued)

Primary Examiner — Nikolay K Yushin

(57) ABSTRACT

The presented devices and methods are directed to efficient and effective photon emission. In one embodiment, high-performance tunnel junction deep ultraviolet (UV) light-emitting diodes (LEDs) are created using plasma-assisted molecular beam epitaxy. The device heterostructure was grown under slightly Ga-rich conditions to promote the formation of nanoscale clusters in the active region. The nanoscale clusters can act as charge containment configurations. In one exemplary implementation, a device operates at approximately 255 nm light emission with a maximum external quantum efficiency (EPE) of 7.2% and wall-plug efficiency (WPE) of 4%, which are nearly one to two orders of magnitude higher than previously reported tunnel junction devices operating at this wavelength. The devices exhibit highly stable emission originating from highly localized carriers in Ga-rich regions formed in the active region, with nearly constant emission peak with increasing current density up to 200 A/cm$^2$, due to the strong charge carrier confinement related to the presence of nanoclusters (e.g., Ga-rich) and radiative emission originating from highly localized carriers in Ga-rich regions formed in the active region.

21 Claims, 19 Drawing Sheets

(51) Int. Cl.
*H10H 20/81* (2025.01)
*H10H 20/812* (2025.01)
*H10H 20/816* (2025.01)
*H10H 20/825* (2025.01)

(56) References Cited

U.S. PATENT DOCUMENTS

| | | | |
|---|---|---|---|
| 10,985,285 B2* | 4/2021 | Yonkee | H01L 21/0254 |
| 2019/0148593 A1* | 5/2019 | Islam | H01L 33/02 |
| | | | 257/13 |
| 2019/0207043 A1* | 7/2019 | Yonkee | H01L 21/02579 |
| 2019/0371963 A1* | 12/2019 | Charles | H01L 33/025 |

* cited by examiner

500

510
Growing a contact region is grown on a substrate.

520
Performing an active region formation process, wherein doping concentrations in doped regions associated with the active region are graded and an active region includes non-uniform charge containment regions.

530
Creating a tunnel junction structure.

FIG 5

LIGHT EMITTING DEVICE

RELATED APPLICATIONS

The present invention claims the benefit of and priority to USPTO Provisional Application No. 63/210,440 entitled "ALGAN TUNNEL JUNCTION LIGHT EMITTING DIODE" filed on Jun. 14, 2021, which is incorporated herein by reference.

BACKGROUND

Light within the UV-C wavelength range (<280 nm) inactivates pathogens and can be used for the prevention of spoilage of food as well as for healthcare applications. Such critical applications have taken on an even more pressing need as UV-C light can effectively contain the spread of infectious diseases, making it a vital tool against the next global pandemic. Currently, mercury and xenon lamps are primarily used for these applications. AlGaN based deep UV optoelectronic devices, however, are revolutionizing the industry, enabling much broader applications due to the absence of toxic materials, tunable emission wavelengths, significantly reduced power consumption, and relative ease of installation and use. To date, emission in the 260-280 nm range is commonly used for this purpose. Recent work has shown that emission at even shorter wavelengths (higher energies), from 255 nm to 220 nm, can be more effective at sterilization, while the reduced photon penetration depth in skin can avoid the deleterious effects of human exposure to UV light. At present, external quantum efficiency (EQE) over 20% has been measured for UV light-emitting diodes (LEDs) with emission at 275 nm, and ~10% for LEDs at approximately 265 nm. For LEDs emitting at approximately 255 nm, EQE in the range of 1-3% has been commonly reported. With proper device packaging, the highest reported EQE is only around 4.5%, with very limited wall-plug efficiency (WPE) less than 4%, primarily due to the difficulty in p-type doping and the resulting of poor hole transport. III-nitrides have highly asymmetric doping: the hole mobilities and concentrations of AlGaN are typically over one to several orders of magnitude lower than those for electrons. The vast imbalance in the electron and hole injection to the active region has several detrimental impacts on device performance, including significantly reduced carrier injection efficiency, severe electron overflow, and parasitic recombination outside the active region. Recent studies further suggests that electron overflow, among other factors such as Joule heating, Auger recombination, and carrier delocalization, is a primary cause for the efficiency droop observed in UV LEDs.

Tunnel junction structures have been investigated as an alternative to resistive p-AlGaN contact layers and absorptive p-GaN contact layers in UV LEDs. The reduced resistivity of the n-AlGaN contact layer helps to increase carrier injection to the active region and improve current spreading, leading to UV-C LEDs operating at 265 nm with EQE>10%. Previous work has investigated the critical effect of the thickness of the tunnel junction and doping of the p-AlGaN layers on device characteristics. Earlier studies on nitride tunnel junction structures have also shown that the transport of carriers across the tunnel junction is primarily determined by trap-assisted tunneling, indicating the crucial role of incorporating defects around the tunnel junction to maximize hole injection. To date, however, there have been no demonstrations of tunnel junction UV LEDs operating at wavelengths below 260 nm with an EQE of more than 0.1%.

Molecular beam epitaxy (MBE) offers distinct advantages over metal-organic chemical vapor deposition (MOCVD) for the growth of tunnel junction deep UV LEDs, due to the much more efficient incorporation of Mg-dopant incorporation in wide bandgap AlGaN. Moreover, by varying the growth conditions, nanoscale clusters can be formed in Al-rich AlGaN, which can provide strong carrier confinement and therefore effectively reduce nonradiative recombination as well as quantum-confined Stark effect (QCSE), resulting in high efficiency deep UV emission.

SUMMARY

Efficient and effective photon emitting devices are presented. In one embodiment, a emitting device comprises: a graded p-doped region, with a higher concentration of p-dopants towards one side of the p-doped region and a lower concentration of p-dopants towards an opposite side of the p-doped region; an active region, wherein at least two charge confinement structures within the active region are not uniform; and a n-doped region. In one embodiment, the light emitting device is an ultra-violet (UV) light emitting diode (LED) device. In one exemplary implementation, the n-doped region is a graded n-doped region with a higher concentration of n-dopants towards one side of the n-doped region and a lower concentration of n-dopants towards an opposite side of the n-doped region. In one embodiment, the active region comprises quantum well heterostructures with barrier layer thicknesses varying from the n-doped region to the p-doped region in a configuration that enhances hole injection and transport. The thickness can decrease from the n-doped region to the p-doped region. The active region includes charge containment configurations (e.g., quantum wells, quantum lines, quantum dots, nanoclusters, etc.) wherein at least two of the nanoclusters are not uniform.

It is appreciated a device can emit light at various wavelengths (e.g., an ultraviolet range, a wavelength of approximately 210 nm to 260 nm, a wavelength of approximately 255 nm, plus or minus 5 nanometers, etc.). In one embodiment, an active region is configured to emit the light. In one exemplary implementation, the graded p-doped region comprises p-AlGaN, the active region comprises AlGaN, and the n-doped region comprises n-AlGaN. In one embodiment, a light emitting device comprises a tunnel junction, wherein the tunnel junction includes a second p-doped region, an intermediate tunnel region, and a second n-doped region, wherein the second p-doped region and second n-doped region have different doping configurations than the graded p-doped region and graded n-doped region.

In one embodiment, a method comprises growing a contact region on a substrate, performing an active region formation process, and creating a tunnel junction structure. The active region is coupled to the contact region and the tunnel junction. Doping concentrations in doped regions associated with the active region are graded and the active region includes non-uniform charge containment regions. In one embodiment, the active region includes a light emitting material. The active region can emit light in various ranges (e.g., the ultra violet (UV) range, 210 nm to 260 nm range, etc.). In one exemplary implementation, the active region includes a p-doped region graded down from approximately 90% to approximately 75% over approximately 20 nm.

In one embodiment, a light emitting device comprises a tunnel junction structure, a gradient p-doped layer, an active region, and a n-doped layer. In one exemplary implementation, the active region includes a non-uniform charge containment region. The gradient p-doped layer, the tunnel junction structure, the active region, and the n-doped layer are configured to emit light (e.g., ultraviolet, with a wavelength of approximately 210 nm to 260 nm, etc.). In one exemplary implementation, the light emitting device exhibits highly stable light emission at approximately 255 nm with virtually no change in peak emission for injection current densities up to 200 A/cm$^3$. The gradient p-doped layer, the tunnel junction structure, the active region, and the n-doped layer can be configured to emit light with an external quantum efficiency (EQE) of greater than 5% with a wavelength of less than 260 nm. The gradient p-doped layer, the tunnel junction structure, the active region, and the n-doped layer can be configured to have a wall plug efficiency WPE of more than 4%. In one embodiment, the active region comprises Ga(Al)N quantum well heterostructures with barrier layer thicknesses decreasing from a n-AlGaN to a p-AlGaN sides to enhance hole injection and transport. The gradient p-doped layer, the tunnel junction structure, the active region, and the n-doped layer can be configured to have a current rectification ratio of greater than 10 to the 7th at 10 Volts, plus or minus 1 volt.

In one embodiment, the light emitting device is a light emitting diode (LED) device. In one exemplary implementation, the n-doped region includes a bottom n-$Al_{0.75}Ga_{0.25}N$ contact layer and a layer wherein the n-AlGaN is graded up from 75% Al composition to 90%, the active region includes quantum wells with decreasing barrier widths, the gradient p-doped layer includes a p-doped AlGaN electron blocking layer (EBL), with Al composition graded down from 90% to 75%, the tunnel junction structure includes a highly doped p-$Al_{0.75}Ga_{0.25}N$ layer, a GaN layer, and a heavily doped n-$Al_{0.75}Ga_{0.25}N$ top contact layer.

BRIEF DESCRIPTION OF THE DRAWINGS

The accompanying drawings, which are incorporated in and form a part of this specification, are included for exemplary illustration of the principles of the present invention and are not intended to limit the present invention to the particular implementations illustrated therein. The drawings are not to scale unless otherwise specifically indicated.

FIG. 5 is a block diagram of an exemplary method in accordance with one embodiment.

DETAILED DESCRIPTION

Figure 1:
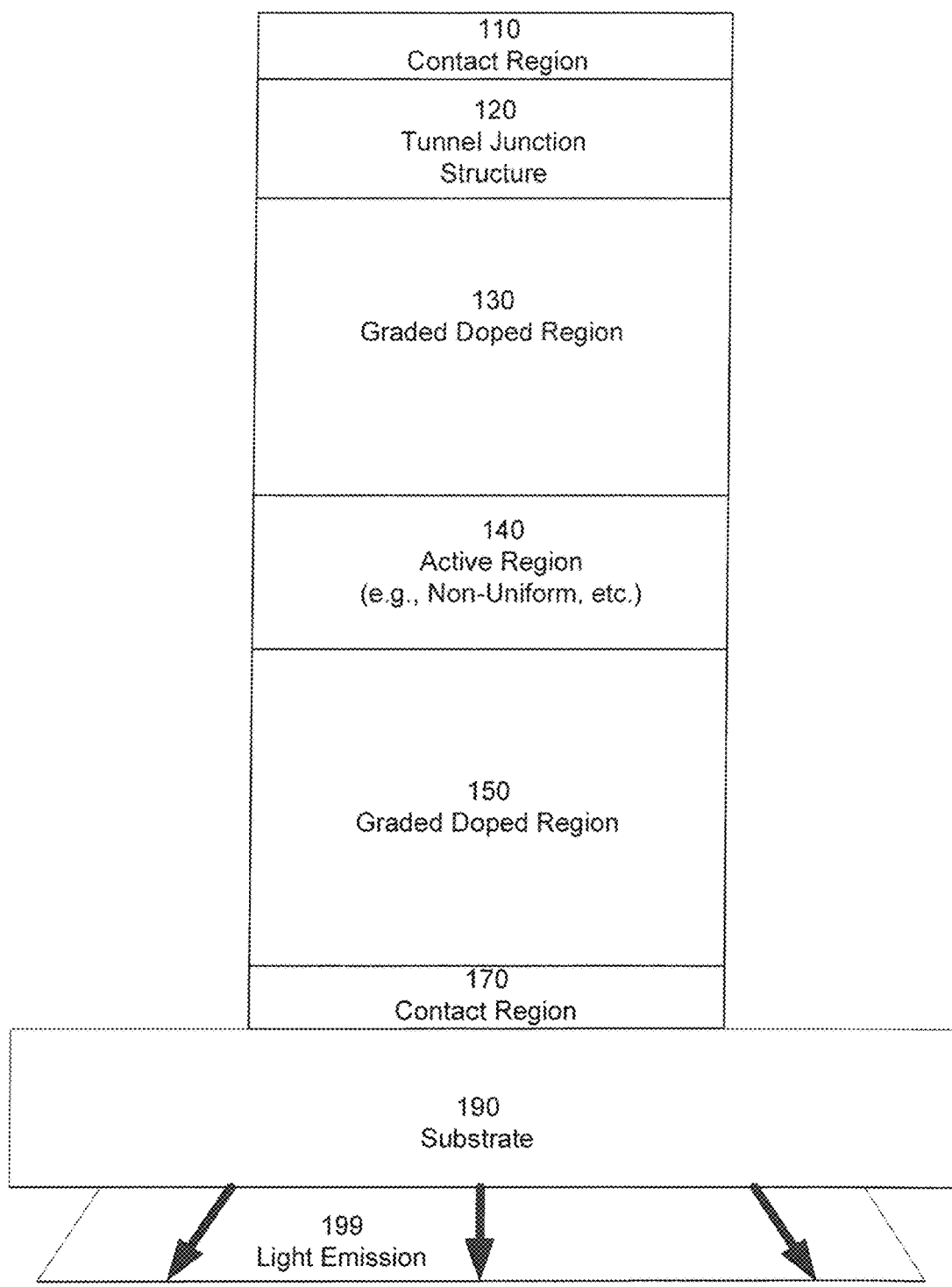
FIG. 1 is a block diagram of an exemplary light emitting device in accordance with one embodiment.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The figures are not necessarily drawn to scale, and only portions of the devices and structures depicted, as well as the various layers that form those structures, are shown. For simplicity of discussion and illustration, only one or two devices or structures may be described, although in actuality more than one or two devices or structures may be present or formed. Also, while certain elements, components, and layers are discussed, embodiments according to the invention are not limited to those elements, components, and layers. For example, there may be other elements, components, layers, and the like in addition to those discussed.

Efficient and effective photon emitting devices and methods are presented. It is appreciated the photon emitting devices include various configurations. In one embodiment, a photon emitting device includes non-uniform charge containment region. In one exemplary implementation, a light emitting device includes a tunnel junction. In one embodiment, a photon emitting device includes combinations of structures and features (e.g., non-uniform charge containment region, a tunnel junction, a graded doped region, etc.).

In the past, temperature-dependent measurements suggest several critical factors that limit the traditional device performance, including charge carrier (hole) transport, electron overflow, and Joule heating. The presented devices and methods provide a promising path for overcoming at least some problematic issues with conventional approaches and achieving higher efficiency for photon emitting devices that were previously challenging.

In one exemplary embodiment, a light emitting region/material with non-uniform charge containment configurations/regions (e.g., quantum wells, quantum dots, nanocluster, etc.) exhibits highly stable photon/light emission (e.g., with nearly constant emission peak with increasing current, etc.) due to the strong localized charge carrier confinement (e.g., related to the presence of non-uniform configurations of nanoclusters, quantum wells, quantum dots, etc.), unlike traditional approaches with significant reduced carrier injection efficiency associated with significant imbalance in the electron and hole injection (e.g., to an active region, p-doped region, etc.). The strong localized charge carrier confinement can have various configurations (e.g., related to the presence of non-uniform configurations of nanoclusters, quantum wells, quantum dots, etc.). In one exemplary implementation, charge containment regions have reduced barrier thickness closer to the p-doped side that help increase hole injection into the quantum wells, thereby leading to more even charge carrier distribution in the active region. In one embodiment, an ultra violet (UV) light emitting diode (LED) has a maximum external quantum efficiency (EQE) and wall-plug efficiency (WPE) that are one to two orders of magnitude higher than those reported previously for tunnel junction LEDs operating at the UV wavelengths.

In one embodiment, graded doped regions are coupled to an active region. In one exemplary implementation, graded doped regions coupled to an active region improve light emission characteristics (e.g., peak wavelength emission, the full-width half maximum wavelength, etc.). It is appreciated that luminescence from an acceptor related transitions in a graded doped layer can also improve light emission characteristics. In one embodiment, broadening of the linewidth occurs primarily on the longer wavelength side of the emission peak, which can be explained by luminescence from recombination of carriers within a graded p-doped region.

In one embodiment, a light emitting device comprises a doped region with a first type of doping coupled to an active region and another doped region with a second type of doping. In one embodiment, a doped region is graded with different concentrations of dopant. In a graded doped region with a first type of doping, a concentration of first type dopants is graded (e.g., with a higher concentration of first type dopants towards one side of the first type graded doped region and a lower concentration of the first type dopants towards an opposite side of the first type graded doped region, etc.). In a graded doped region with a second type of doping, a concentration of second type dopant is graded (e.g., with a higher concentration of second type dopants towards one side of the second type graded doped region and a lower concentration of the second type dopant towards an opposite side of the second type graded doped region, etc.). The active region includes a plurality of charge confinement quantum configurations/regions (e.g., structures, features, characteristics, etc.) and least two of the plurality of charge confinement quantum configurations within the active region are not uniform. It is appreciated there are various implementations of charge confinement quantum configurations (e.g., quantum well, quantum line, quantum dots, nanoclusters, etc.). In one embodiment, the light emitting device includes a tunnel junction. In one exemplary implementation, a tunnel junction is coupled between a region with a first type dopant and a region with a second type dopant. In one embodiment, the tunnel junction is coupled to a region graded with different concentrations of a dopant.

In one embodiment, a light emitting device includes a tunnel junction structure. The incorporation of a thin tunnel junction layer (e.g., GaN, etc.) sandwiched between the tunnel junction structure p-region (e.g., p-AlGaN, etc.) and the tunnel junction structure n-region (e.g., n-AlGaN, etc.) can significantly reduce the depletion width and enhance tunneling probability by taking advantage of the large polarization charges generated at the interfaces. In one embodiment, the top layer of the of tunnel junction structure serves as part of a contact layer. The doped regions can be heavily doped. In one embodiment, a tunnel junction structure is coupled to a graded doped region and creates enhanced doping due to the strong spontaneous and piezoelectric polarization, which can maximize the injection of a charge carrier (e.g., holes, electrons, etc.). In one exemplary implementation, a tunnel junction structure coupled to a graded doped region also improves current rectification due to the reduced leakage current in the present devices. In one exemplary implementation, a tunnel junction structure coupled to a graded doped region allows increased hole penetration while preventing or reducing electron leakage compared to conventional approaches.

It is appreciated that various methods of fabrication (e.g., molecular beam epitaxy (MBE), etc.) can be utilized. In one embodiment, MBE offers distinct advantages over MOCVD for the growth of tunnel junction deep UV LEDs, due to the much more efficient incorporation of Mg-dopant incorporation in wide bandgap AlGaN.

In one embodiment, a light emitting device is configured to emit light with a wavelength of less than 260, an external quantum efficiency (EQE) of greater than 5%, and a wall plug efficiency WPE of more than 4%, unlike conventional attempts at high efficiency deep UV emission and varying the growth conditions (e.g., formation of nanoscale clusters in Al-rich AlGaN, etc.) to provide strong carrier confinement and effectively reduce nonradiative recombination as well as quantum-confined Stark effect (QCSE). In one exemplary implementation, the device is a UV-C LED.

While most of the description is directed to UV LEDs emitting light in a 255 nm wavelength range, the presented active region light emitting materials and tunnel junctions have novel aspects in other applications and devices (e.g., operating at different wavelengths, lasers, etc.).

FIG. 1 is a block diagram of an exemplary light emitting device 100 in accordance with one embodiment. Light emitting device 100 includes contact region 110, tunnel junction structure 120, graded dope region 130, active region 140, graded doped region 150, contact region 170, and substrate 190. Tunnel junction structure 120 is coupled to contact region 110 and graded doped region 130. Graded doped region 130 is coupled to active region 140 which is coupled to graded doped region 150. Contact region 170 is coupled to graded doped region 150 and substrate 190. In one embodiment, the regions correspond to layers in the device.

In one embodiment, the concentration of charge carriers varies in the graded doped regions 130 and region 150. There is a higher concentration of charge carriers towards one side of the graded doped regions 130 and 150 and a lower concentration of charge carriers towards an opposite side of the graded doped regions 130 and 150. The concentration of holes can be graded with a higher concentration of holes towards one side of the graded p-doped region and a lower concentration of holes towards an opposite side of the graded p-doped region. The concentration of electrons can be graded with a higher concentration of electrons towards one side of the graded n-doped region and a lower concentration of electrons towards and opposite side of the graded n-doped region. In one embodiment, graded doped region 130 and graded doped region 150 have different types of doping (e.g., p-type, n-type, etc.). In one exemplary implementation, graded doped region 130 is a p-type doped region and graded doped region 150 is a n-type doped region.

It is appreciated the regions of light emitting device 100 can include various configurations (e.g., features, structures, characteristics, etc.). In one exemplary implementation, active region 140 includes a plurality of charge confinement quantum configurations (e.g., quantum wells, quantum lines, quantum dots, nanoclusters, etc.) and at least two of the plurality of charge confinement quantum configurations within the active region are not uniform. In one embodiment, active region 140 is considered an intermediate region between a p-type region and a n-type region (e.g., a P-I-N configuration, etc.).

In one embodiment, a tunnel junction configuration (e.g., feature, structure characteristic, etc.) includes a first type doped region, a tunnel region, and a second type doped region. The first type doped region and second type doped region can be heavily doped. In one exemplary implementation, the tunnel junction structure 120 includes a p-doped region, an intermediate tunnel region, and a second n-doped region.

In one embodiment, light emitting device 100 can emit photons (e.g., light, radiation, etc.). In one exemplary implementation, light emitting device 100 emits light 199. In one embodiment, the p doped layer, intermediate active region, and n doped region are configured to emit light. Light can be emitted in the ultra violet range. Light can be emitted in a wavelength of approximately 210 nm to 260 nm. Light can be emitted with a wavelength of approximately 255 nm, plus or minus 5 nanometers.

Figure 2:
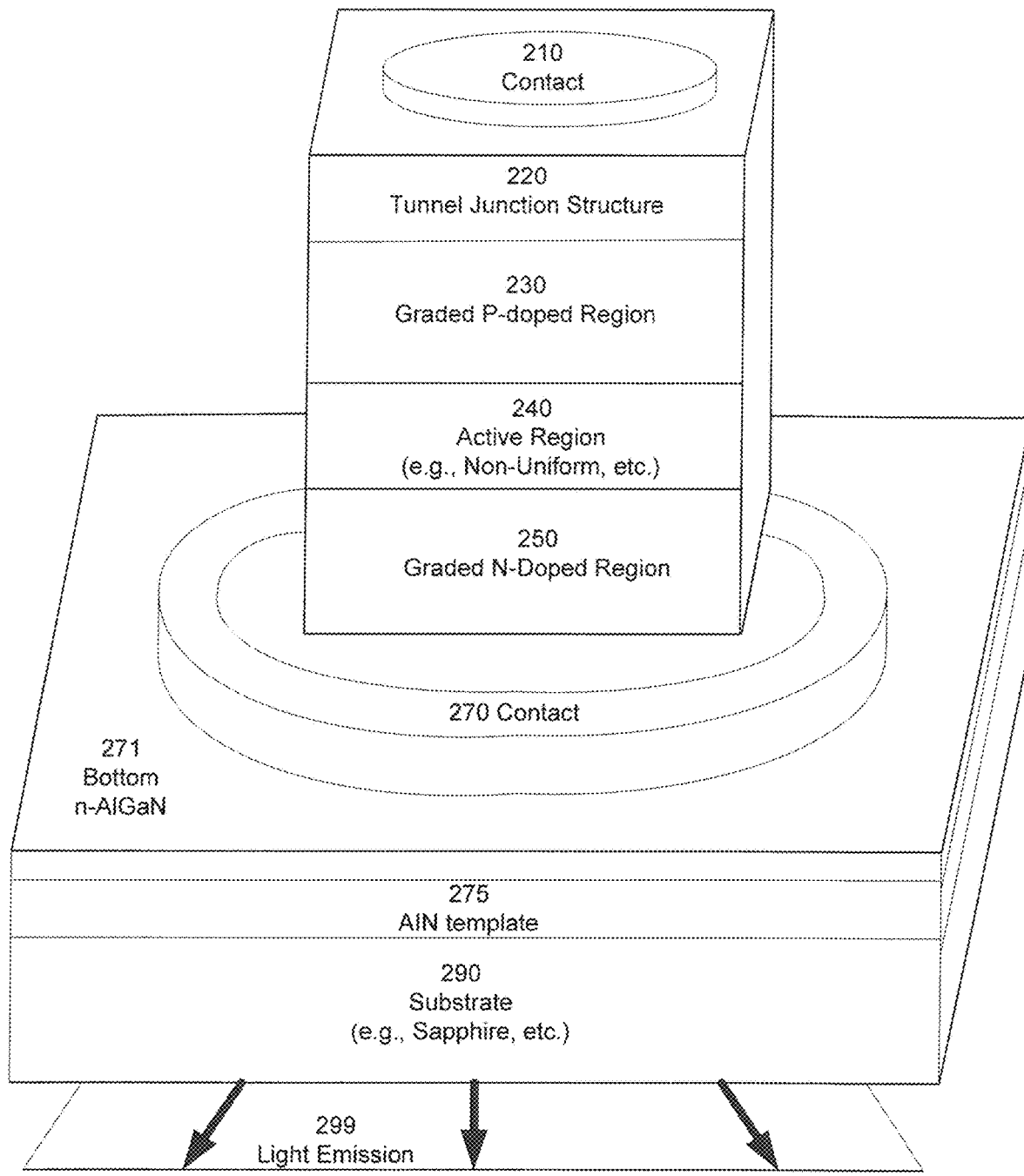
FIG. 2 is a block diagram of an exemplary LED in accordance with one embodiment.

It is appreciated that a light emitting device can be utilized in various applications (e.g., LEDs, lasers, etc.) and can emit various types of light. FIG. 2 is a block diagram of an exemplary LED 200 in accordance with one embodiment. Light emitting device 200 includes contact region 210, tunnel junction structure 220, graded p-doped region 230, active region 240, graded n-doped region 250, contact region 270, and substrate 290. Tunnel junction structure 220 is coupled to contact region 210 and graded p-doped region 230. The graded p-doped region 230 is coupled to active region 240 which is coupled to graded n-doped region 250. Second contact region 270 is coupled to graded n-doped region 250 and substrate 290.

In one embodiment, LED 200 also includes bottom region 271 and AlN template 275. Contact 270 is coupled to bottom region 271 which is coupled to AlN template 275, which in turn is coupled substrate 290. In one exemplary implementation, substrate 290 is a sapphire substrate. LED 200 can emit light 299. Light emission 299 can be considered a backside emission.

Figure 3:
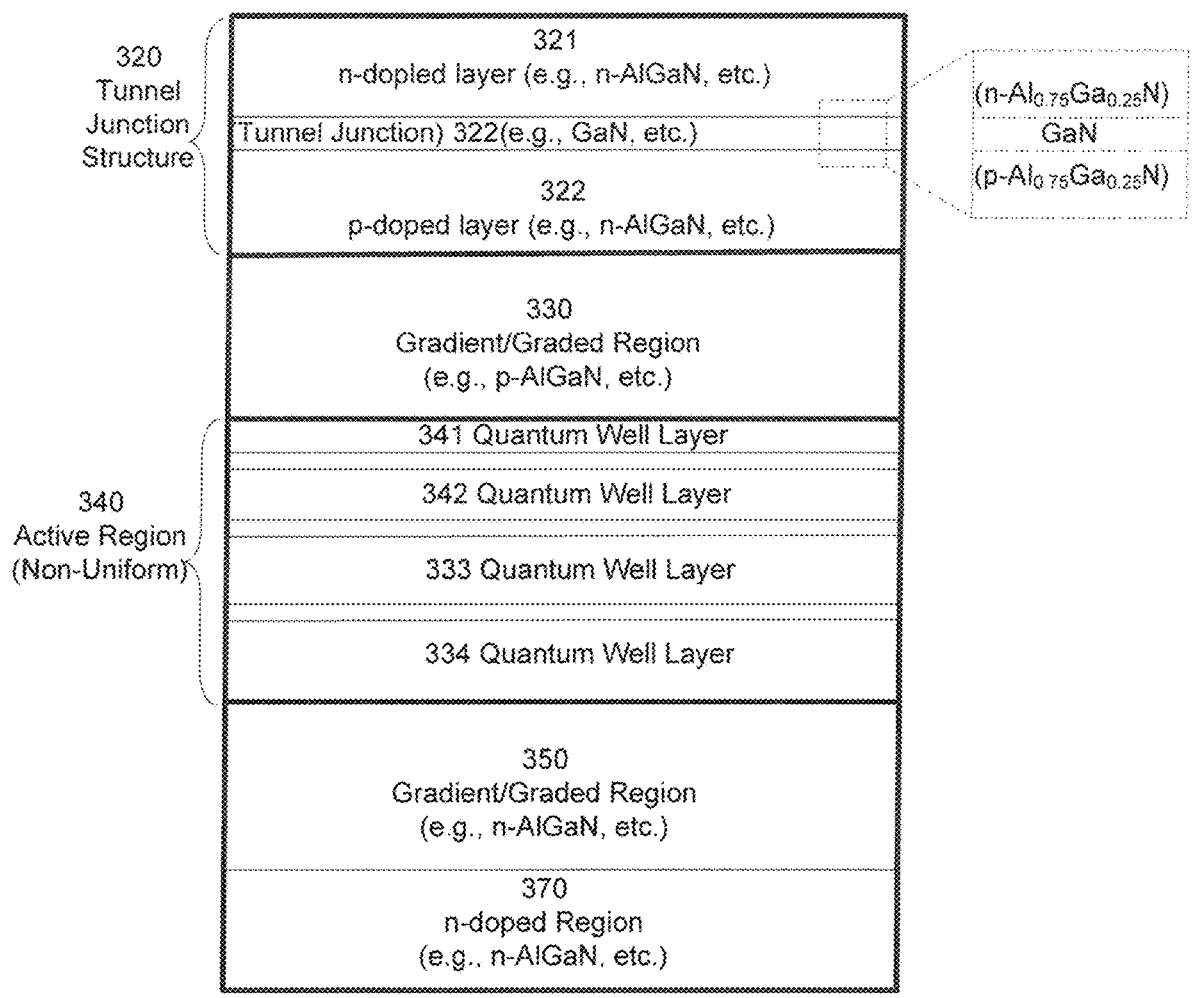
FIG. 3 is a block diagram of an exemplary light emitting device in accordance with one embodiment.

It is appreciated, a light emitting device can be made of various materials in various configurations. FIG. 3 is a block diagram of exemplary light emitting device 300 in accordance with one embodiment. In one exemplary implementation, light emitting device 300 is a deep ultraviolet (UV) light emitting diode (LED). Light emitting device 300 tunnel junction structure 320, graded p-doped region 330, active region 340, graded n-doped region 350, and n-doped region 370. Tunnel junction structure 320 is coupled to contact region 310 and graded p-doped region 330. The graded p-doped region 330 is coupled to active region 340 which is coupled to graded n-doped region 350. Second contact region 370 is coupled to graded n-doped region 350 and n-doped region 370.

Tunnel junction structure 320 includes a n-doped layer 321, a tunnel junction or tunnel layer 322, and a p-doped layer 323. In one embodiment, n-doped layer 321 includes n-AlGaN, tunnel layer 322 includes GaN, and p-doped layer 323 includes p-AlGaN. The tunnel junction or tunnel layer 322 can be very thin. The marked/blown up region in FIG. 3 shows the tunnel junction. In one exemplary implementation, n-doped layer 321 includes n-$Al_{0.75}Ga_{0.25}N$ and p-doped layer 323 includes p-$Al_{0.75}Ga_{0.25}N$ close to tunnel junction or tunnel layer 322.

In one embodiment, active region 340 includes quantum wells. The quantum wells can be configured in quantum well layers 341, 342, 343, and 334. It is appreciated quantum wells can have various configurations. The various configurations can include varying charge confinement characteristics. The quantum wells can be non-uniform. In one exemplary implementation, active region 340 includes four quantum wells (QWs). The varying configurations can include emitting various wavelengths of light (e.g., 255 nm, 210 nm, 260 nm, etc.). The quantum wells can have varying barrier widths. In one exemplary implementation, the barrier widths vary from 1 nm to 10 nm. In one exemplary implementation, the barrier widths decrease from 6 nm to 3.5 nm.

Figure 4:
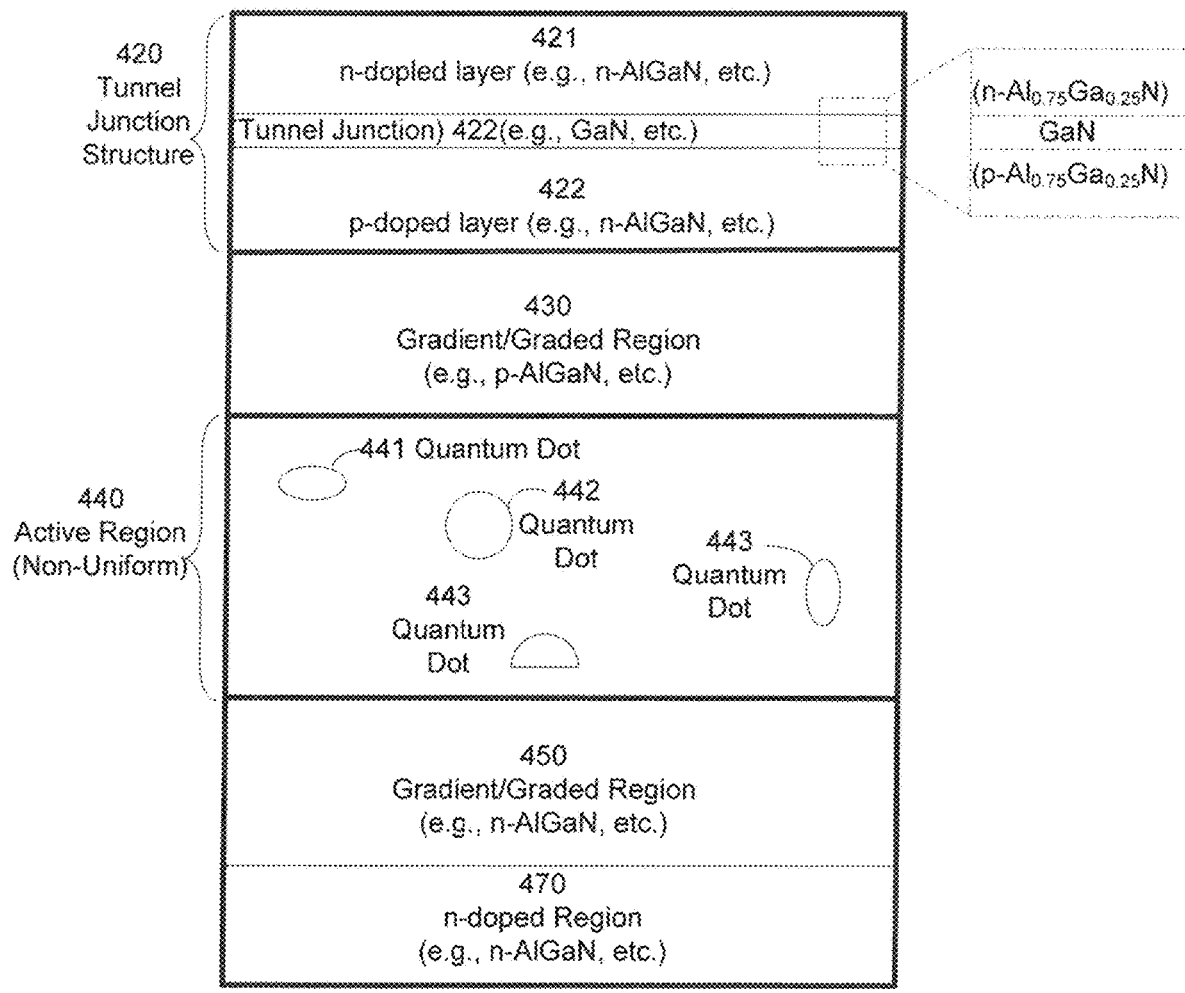
FIG. 4 is a block diagram of another exemplary light emitting device in accordance with one embodiment.

FIG. 4 is a block diagram of exemplary light emitting device 400 in accordance with one embodiment. In one exemplary implementation, light emitting device 400 is a deep ultraviolet (UV) light emitting diode (LED). Light emitting device 400, tunnel junction structure 420, graded p-doped region 430, active region 440, graded n-doped region 450, and n-doped region 470. Tunnel junction structure 420 is coupled to contact region 410 and graded p-doped region 430. The graded p-doped region 430 is coupled to active region 440 which is coupled to graded n-doped region 450. Second contact region 470 is coupled to graded n-doped region 450 and n-doped region 470.

In one embodiment, active region 440 includes nanoclusters or quantum dots 441, 442, 443, and 434. It is appreciated quantum dots can have various configurations. The various configurations can include varying charge confinement characteristics. The quantum dots can be non-uniform. The varying configurations can include emitting various wavelengths of light (e.g., 255 nm, 210 nm, 260 nm, etc.). In one embodiment, the quantum dots are configured in layers with different charge confinement characteristics.

FIG. 5 is a block diagram of exemplary method 500 in accordance with one embodiment. In one exemplary implementation, a light emitting device is manufactured. In one embodiment, a AlGaN tunnel junction deep UV LED is grown using a Veeco Gen930 MBE system equipped with a radio frequency plasma-assisted nitrogen source. The device heterostructures are grown on AlN-on-sapphire templates from DOWA Holdings Co. Ltd. In one embodiment, a nitrogen flow of 0.6 sccm and an RF power of 350 W is used throughout the growth, resulting in a growth rate of 160 nm/hr. It is appreciated that various growth processes can be utilized in method 500.

In block 510, a contact region is grown on a substrate. In one embodiment, a 500 nm thick bottom n-$Al_{0.75}Ga_{0.25}N$ contact layer is grown with a Si atom concentration ~$3\times10^{19}$ $cm^{-3}$. During this growth, several steps of in situ annealing at elevated temperatures can be performed, which can significantly improve the structural and optical properties. In one exemplary implementation, the n-AlGaN was then graded up from 75% Al composition to 90% over approximately ~25 nm.

In block 520, an active region formation process is performed, wherein doping concentrations in doped regions associated with the active region are graded and an active region includes non-uniform charge containment regions. The active region formation process forms an active region coupled to the contact region gown in block 510. In one embodiment, the active region formation process includes growing a graded n-doped region, an active region, and a graded p-doped region. In one exemplary implementation, a graded n-doped region is relatively close to the substrate (e.g., similar to graded-doped regions 150, 250, 350, 450, etc.). An active region is coupled to the graded n-doped region and graded p-doped region (e.g., similar to active regions 140, 240, 340, 440, etc.), and a graded p-doped region is relatively close to a tunnel junction structure (e.g., similar to graded-doped regions 130, 230, 330, 430, etc.), In one embodiment, the active region formation process includes formation of charge containment regions (e.g., features, structures, characteristics, etc.). The active region formation process can include formation of various types of quantum structures (e.g., quantum wells, quantum lines, quantum dots, nanoclusters, etc.). The charge containment regions (e.g., quantum structures, etc.) are non-uniform. In one exemplary implementation, the active region includes multiple layers with quantum wells (QWs) with varying barrier widths. In one exemplary implementation, the active region includes 4 layers of AlGaN quantum wells (QWs) emitting light at approximately 255 nm, with the barrier width decreasing from 6 nm to 3.5 nm. Simulations have shown that the reduced barrier thickness closer to the p-doped side of LEDs can help improve device performance by increasing hole injection into the quantum wells, thereby leading to more even charge carrier distribution in the active region.

In block 530, a tunnel junction structure is created. The tunnel junction structure is coupled to a graded doped region formed in block 520. In one embodiment, a charge blocking layer is grown. In one exemplary implementation, a p-doped AlGaN electron blocking layer (EBL) is grown, with Al composition graded down from 90% to 75% over 20 nm. The graded-down AlGaN layer results in an enhanced p-type doping due to the strong spontaneous and piezoelectric polarization of AlGaN, which can maximize the injection of holes. In one exemplary implementation, prior to the tunnel junction, a 25 nm highly doped p-$Al_{0.75}Ga_{0.25}N$ layer is grown. A tunnel junction material is grown. In one embodiment, a 5 nm GaN layer tunnel junction material is grown. The Mg atom concentration in the p-doped regions is estimated to be ~$5\times10^{19}$ $cm^{-3}$. An n-doped region is grown coupled to the tunnel junction material. In one embodiment, a thick (e.g., 150 nm, etc.) heavily doped n-$Al_{0.75}Ga_{0.25}N$ is grown, with an annealing step included after the first 100 nm of growth. In one exemplary implementation, a layer of the tunnel junction stricter is included in a contact layer. The incorporation of a thin tunnel junction layer (e.g., GaN, etc.) sandwiched between the tunnel junction structure p-region (e.g., p-AlGaN, etc.) and the tunnel junction structure n-region (e.g., n-AlGaN, etc.) can significantly reduce the depletion width and enhance tunneling probability by taking advantage of the large polarization charges generated at the interfaces. In one embodiment, the top layer of the tunnel junction structure serves as part of a contact layer.

In one embodiment, a growth process is carried out under metal rich conditions. In one embodiment, a growth process is carried out under slightly Ga-rich conditions, which has been previously shown to enhance dopant incorporation and increase the internal quantum efficiency of AlGaN heterostructures. The enhanced luminescence efficiency using this technique has been suggested to be a consequence of compositional inhomogeneities present within the AlGaN. Atomic-resolution high-angle annular dark-field scanning transmission electron microscopy (HAADF-STEM) shows the ordering of Ga-rich atomic layers in the $Al_{0.75}Ga_{0.25}N$ layer; it indicates the presence of compositional non-uniformity within the layer and is consistent with previous reports (e.g., similar to FIGS. 6, 7, etc.). Low frequency background was removed to reduce contrast loss to thickness variation. Fast Fourier transform (FFT) patterns of the HAADF-STEM images exhibit ordering of Ga-rich layer along direction; the peaks are forbidden in electron diffraction pattern of wurtzite hexagonal symmetry. HAADF-STEM was collected using a Cs aberration-corrected JEOL 3100R05 microscope (300 keV, 22 mrad) with a detector angle from 74 to 200 mrad.

In one embodiment, a growth process is carried out under gas rich conditions. In one exemplary implementation, a growth process is carried out under Nitrogen gas rich conditions.

Figure 6:
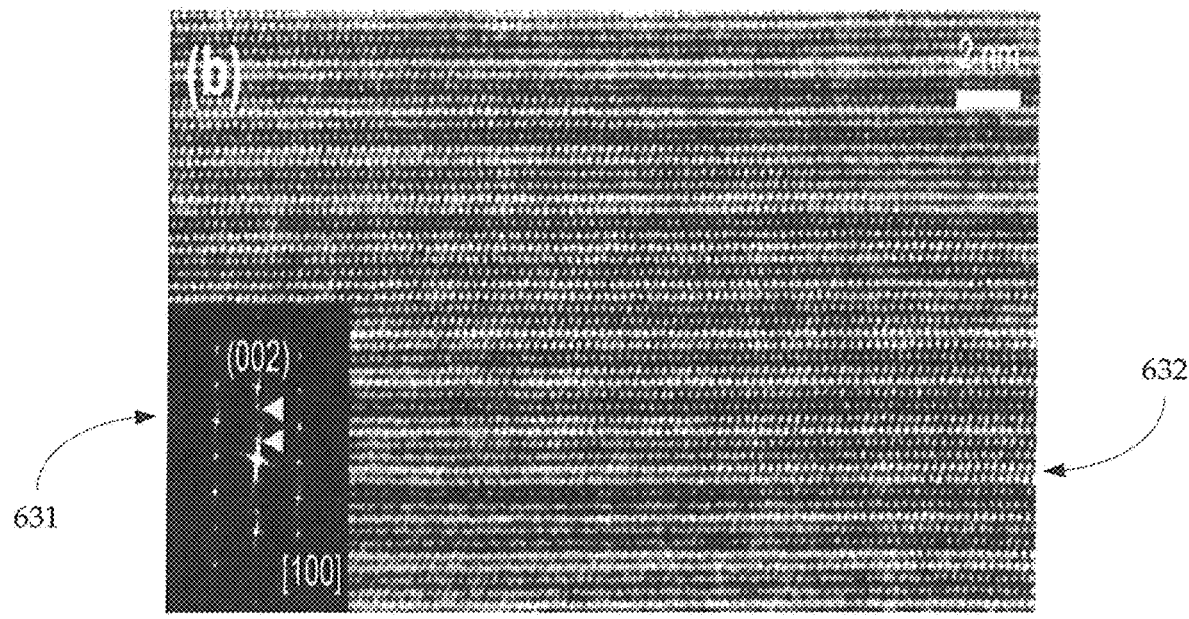
FIG. 6 is an exemplary atomic scale HAADF-STEM image of an $Al_{0.75}Ga_{0.25}N$ layer showing the presence of nanoscale Ga-rich layers due to compositional variation in accordance with one embodiment.
Figure 7:
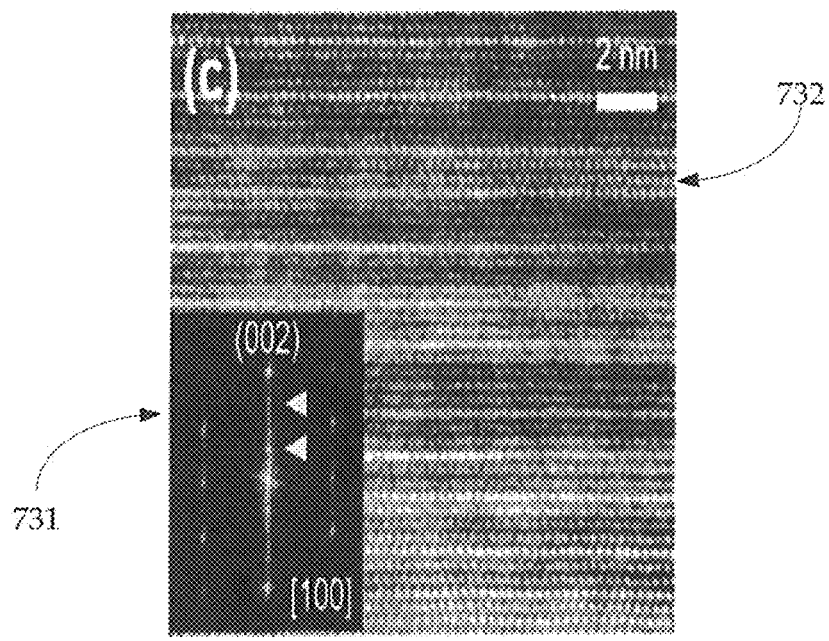
FIG. 7 is another exemplary atomic scale HAADF-STEM image of an $Al_{0.75}Ga_{0.25}N$ layer showing the presence of nanoscale Ga-rich layers due to compositional variation in accordance with one embodiment.

FIG. 6 is an exemplary atomic scale HAADF-STEM image of an $Al_{0.75}Ga_{0.25}N$ layer showing the presence of nanoscale Ga-rich layers due to compositional variation in accordance with one embodiment. FIG. 7 is another exemplary atomic scale HAADF-STEM image of an $Al_{0.75}Ga_{0.25}N$ layer showing the presence of nanoscale Ga-rich layers due to compositional variation in accordance with one embodiment. The brighter regions (e.g., 631, 732, etc.) correspond to higher Ga content. FFT shows the superlattice peak (red arrow/triangle indicators 631, 731, etc.) associated with atomic ordering in wurtzite AlGaN along c-plane direction.

While the Ga-rich growth conditions have distinct advantages, prolonged growth in this regime can lead to the formation of crystalline defects due to the presence of gallium droplets on the sample surface. In one embodiment, to eliminate the excess Ga at the growth interface, the aforementioned annealing steps are incorporated within the growth, wherein the sample temperature is raised by 50° C. above the growth temperature, while keeping the plasma and source shutters closed. The RHEED screen is monitored to ensure that the dim, streaky RHEED pattern during growth gave way to a brighter, streaky pattern which signifies the desorption of excess metal at the growth interface.

Figure 8:
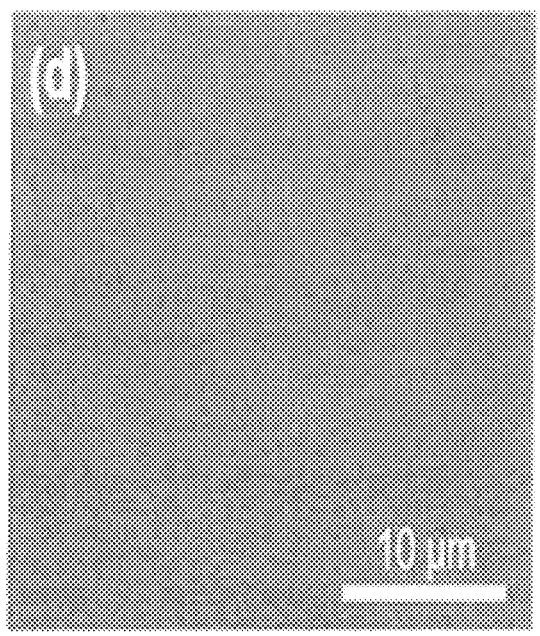
FIG. 8 is a block diagram of an exemplary scanning electron microscope (SEM) image of the sample surface after cleaning following epitaxial growth in accordance with one embodiment.

FIG. 8 is a block diagram of an exemplary scanning electron microscope (SEM) image of the sample surface after cleaning following epitaxial growth in accordance with one embodiment. The SEM image of the sample surface after epitaxial growth shows a smooth surface over a wide area. The SEM does not show the presence of any droplets or defects on the sample surface even over large regions, showing the advantages of the annealing process.

Figure 9:
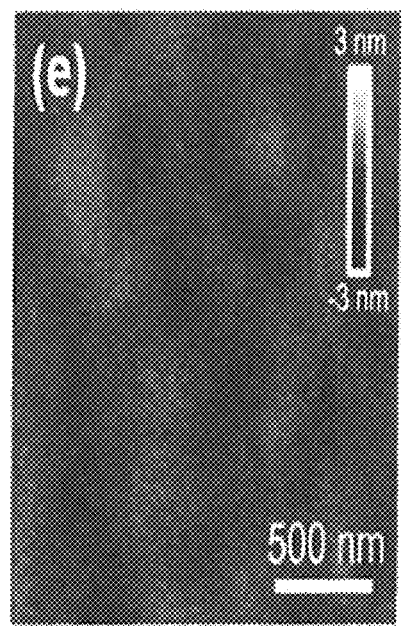
FIG. 9 is a block diagram of an exemplary high-resolution atomic force microscopy (AFM) scan of the surface in accordance with one embodiment.

FIG. 9 is a block diagram of an exemplary high-resolution atomic force microscopy (AFM) scan of the surface in accordance with one embodiment. The high-resolution AFM scan of the sample surface is after epitaxial growth. The high-resolution atomic force microscopy (AFM) scan of the surface depicts a very smooth surface with RMS roughness below 0.5 nm.

Figure 10:
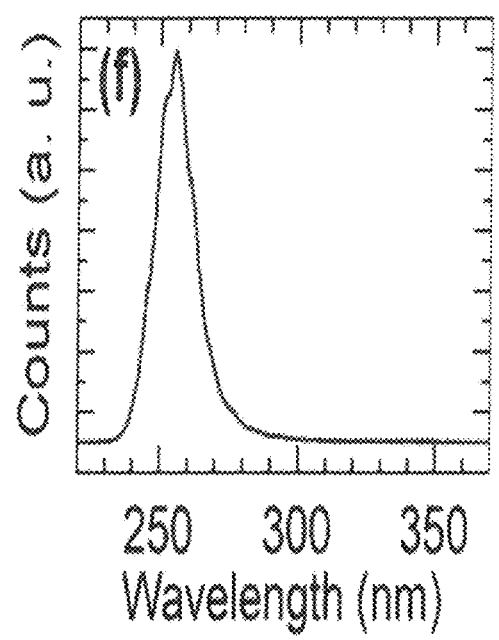
FIG. 10 is an illustration of an exemplary photoluminescence graph in accordance with one embodiment.

FIG. 10 is an illustration of an exemplary photoluminescence graph in accordance with one embodiment. The photoluminescence spectrum is of the sample measured using a 193 nm ArF excimer laser. In one exemplary implementation, the photoluminescence spectrum of the sample is measured using a 193 nm laser for excitation at room temperature. The graph displays an emission with peak at 255 nm. The full-width half maximum is around 20 nm, which is a result of emission from the graded layers surrounding the active region, as well as luminescence from the Mg-acceptor related transitions in the p-doped layers.

In one embodiment, a light emitting device is fabricated using photolithography, etching, and contact metallization techniques. First, argon ion beam milling is used to define the device mesas, with area 30 µm×30 µm. The regions surrounding the device is etched down to the bottom n-AlGaN layer. This is followed by the deposition of a 300 nm thick $SiO_2$ passivation layer. Vias are then etched into the $SiO_2$ to allow for the deposition of Ti/Al/Ni/Au contacts to the top and bottom n-AlGaN layers. The contacts are then annealed at 700° C. in a nitrogen ambient for 30 seconds. A thick reflective Al/Au contact pad is deposited over the devices to maximize light reflection towards the backside of the substrate.

Figure 11:
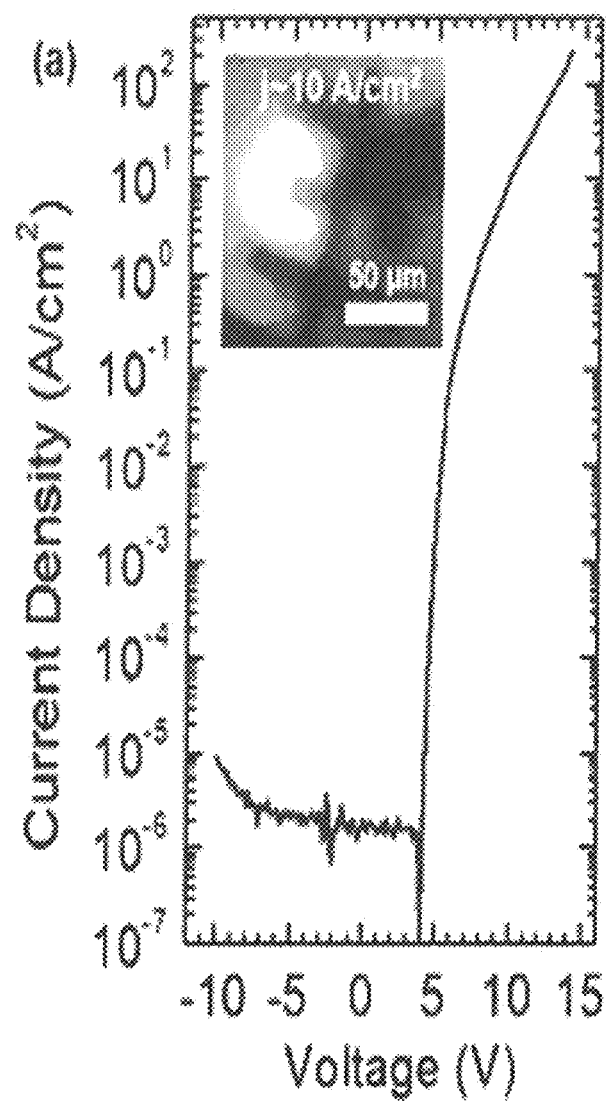
FIG. 11 is a block diagram of exemplary J-V characteristics of a representative device (e.g., the tunnel junction deep UV LED, etc.) in accordance with one embodiment.

In one embodiment, a detector is utilized to obtain power measurements from the backside of the substrate. In one exemplary implementation, the devices are first measured in continuous-wave (CW) operation conditions using a Keithley 2400 SMU. FIG. 11 is a block diagram of exemplary J-V characteristics of a representative device (e.g., the tunnel junction deep UV LED, etc.) in accordance with one embodiment. The device exhibits a sharp turn-on voltage, with negligible reverse leakage current. It is noticed that the device has much improved current rectification, compared to previously reported tunnel junction devices emitting at similar wavelengths, due to the reduced leakage current in the present devices. An image of a device (e.g., an LED under a CW bias, etc.) operating at an injection current density of ~10 $A/cm^2$ is shown in the inset, demonstrating extremely bright luminescence. The electroluminescence from the device was collected using an optical fiber and analyzed through a spectrometer.

Figure 12:
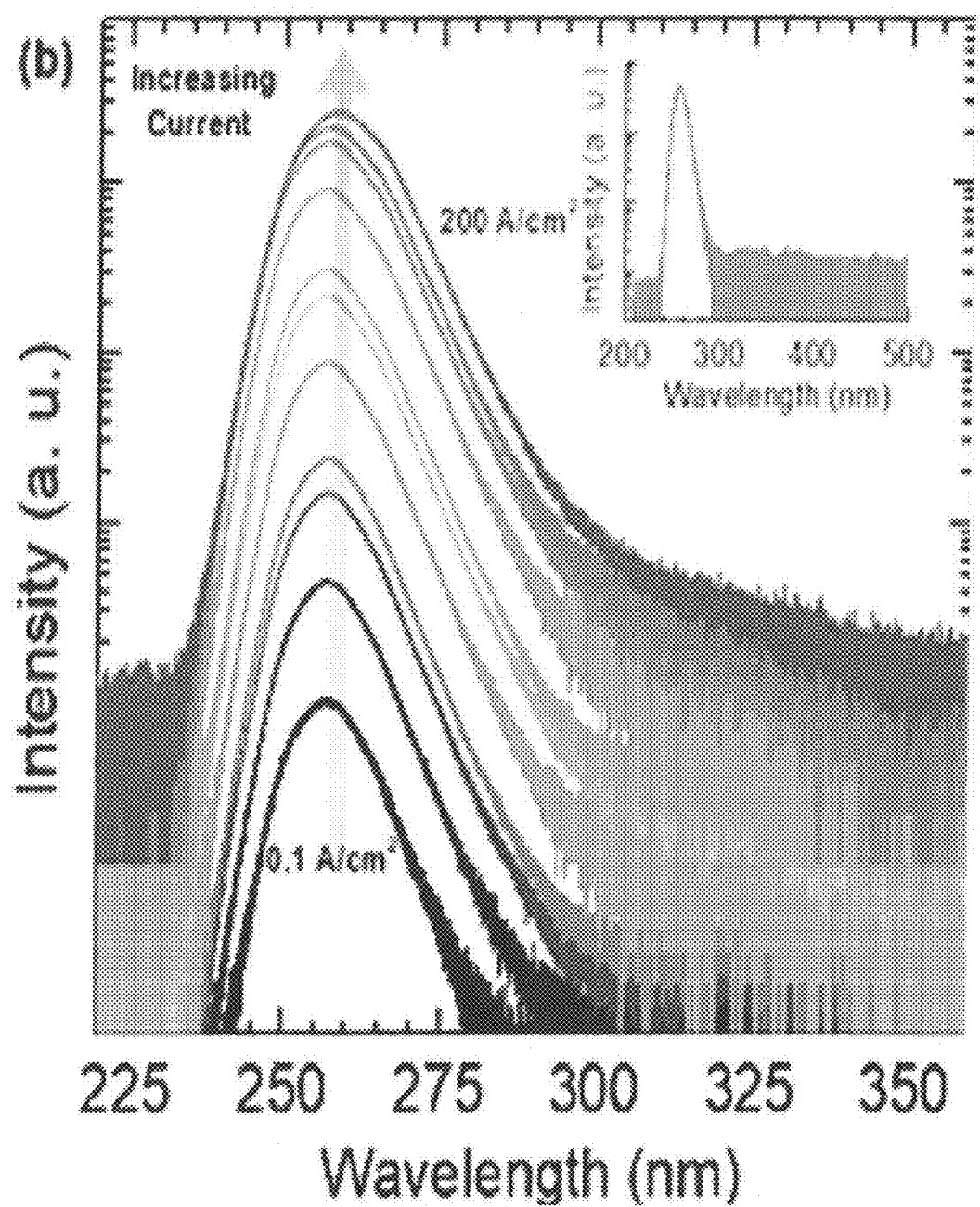
FIG. 12 is a graph illustrating electroluminescence emission spectra measured at different injection currents in accordance with one embodiment.

FIG. 12 is a graph illustrating electroluminescence emission spectra measured at different injection currents in accordance with one embodiment. The inset is a scan over a wider range, confirming the absence of any defect-related emission at longer wavelengths that were often observed in previous studies. The insert illustrates electroluminescence spectrum at an injection current of 10 $A/cm^2$ measured from 200 nm to 500 nm, showing the absence of defect-related emission in accordance with one embodiment. In one exemplary implementation, room-temperature electroluminescence spectra is measured at different injection currents. While the increase in FWHM is gradual up to ~10 $A/cm^2$, at higher current injection the FWHM starts to rapidly increase.

Figure 13A:
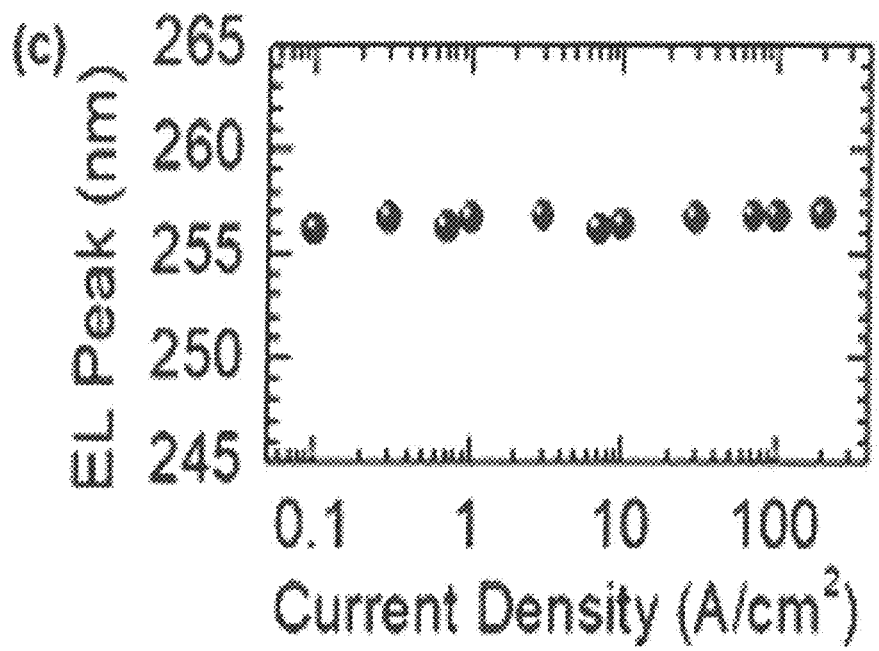
FIG. 13A is a block diagram of an exemplary plot of the peak positions of the electroluminescence spectra at different injected current densities in accordance with one embodiment.

FIG. 13A is a block diagram of an exemplary plot of the peak positions of the electroluminescence spectra at different injected current densities in accordance with one embodiment. The position of the electroluminescence peak is plotted against injection current in FIG. 13A, showing that the emission peak position is highly stable with virtually no variation for injected current densities up to 200 $A/cm^2$, which is in direct contrast to the expected peak variation due to QCSE in AlGaN quantum wells. This can be explained by the strong charge carrier confinement in the Ga-rich nanoclusters in AlGaN quantum wells grown under slightly Ga-rich conditions by MBE.

Figure 13B:
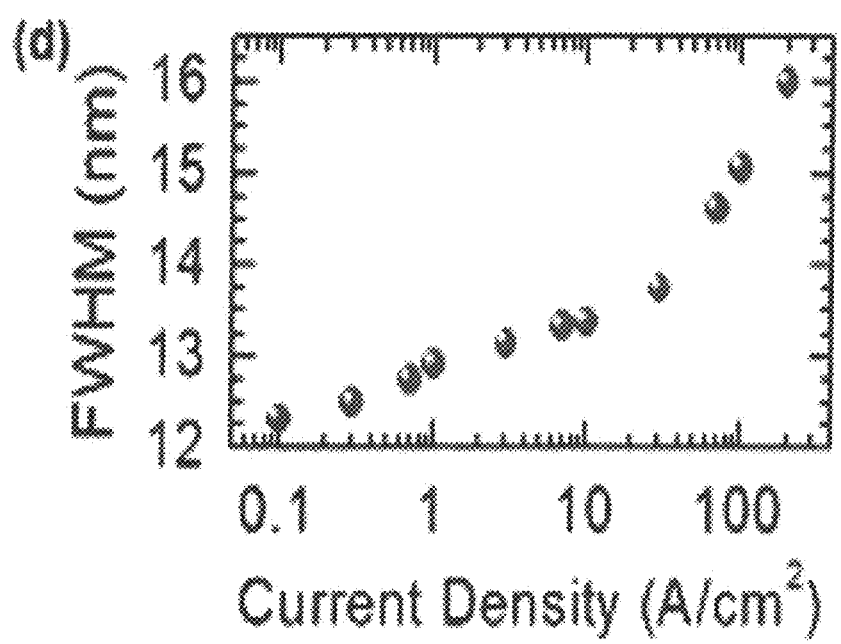
FIG. 13B is a block diagram of an exemplary variation of the full-width half maxima extracted from the electroluminescence spectra recorded at different injected current densities in accordance with one embodiment.
Figure 14A:
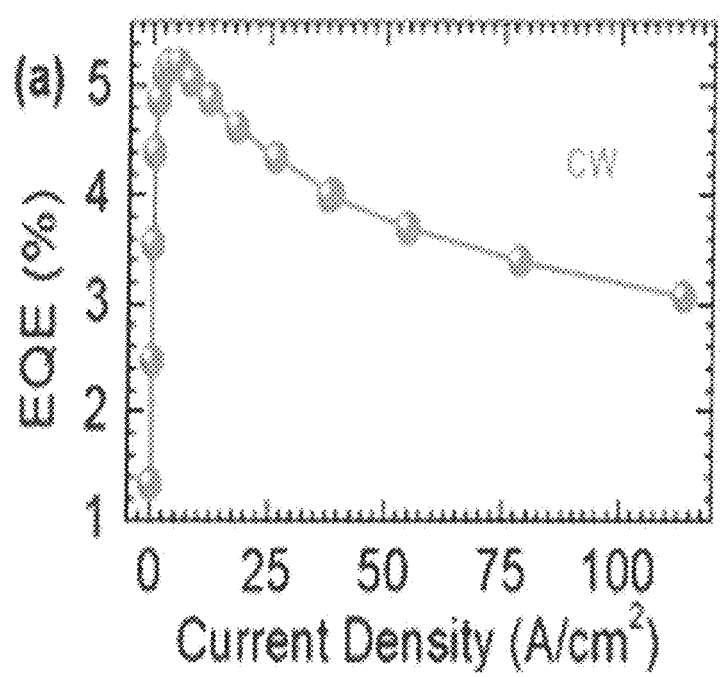
FIG. 14A is a block diagram showing the variation of EQE with injected current density in accordance with one embodiment.
Figure 14B:
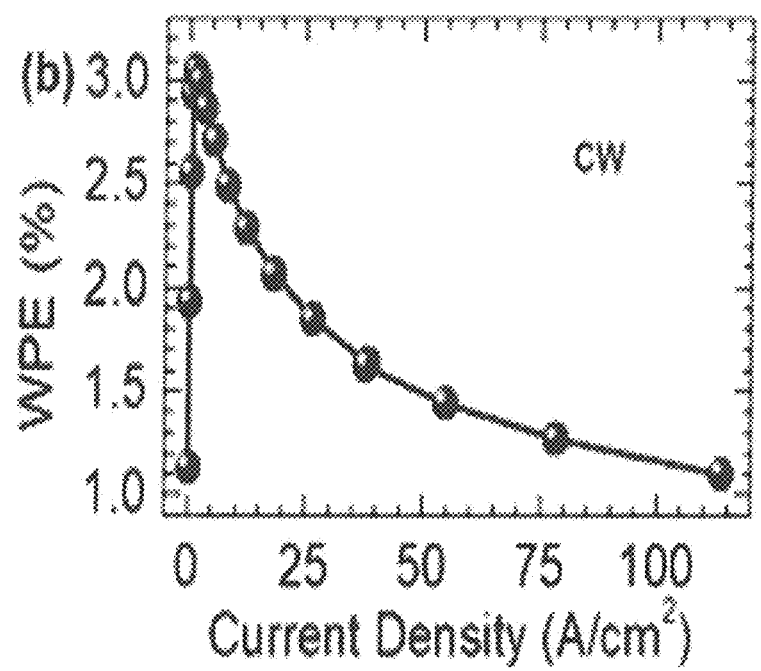
FIG. 14B is a block diagram showing the variation of WPE with injected current density in accordance with one embodiment.

FIG. 13B is a block diagram of an exemplary variation of the full-width half maxima extracted from the electroluminescence spectra recorded at different injected current densities in accordance with one embodiment. FIG. 13B illustrates an increase in the full width half-maximum (FWHM) as seen with increasing injection current in accordance with one embodiment. This broadening of the linewidth occurs primarily on the longer wavelength side of the emission peak, which can be explained by luminescence from recombination of carriers within the graded p-doped region of the device.

In one embodiment, to determine the efficiency of the device, the emitted light from the back of the sample was collected with a Newport 818-ST2-UV photodetector with a Newport Model 1919-R power meter, while the devices were probed using CW bias. FIG. 13A is a block diagram showing the variation of EQE with injected current density in accordance with one embodiment. The maximum EQE measured is 5.2%. The EQE of a tunnel junction deep UV LED vs. current density is measured under CW bias at room temperature. FIG. 13B is a block diagram showing the variation of WPE with injected current density in accordance with one embodiment. The maximum WPE measured is 3%.

The EQE and WPE values in FIGS. 13A and 13B are nearly one to two orders of magnitude higher than previously reported tunnel junction devices operating at such short wavelengths. The light extraction from the presented devices can be increased with proper packaging, which will further improve the efficiency. The WPE vs. current density is measured under CW bias.

In one embodiment, a device can exhibit severe efficiency droop with further increasing current. As the samples are fabricated on sapphire substrates, some amount of heating is expected.

Figure 15A:
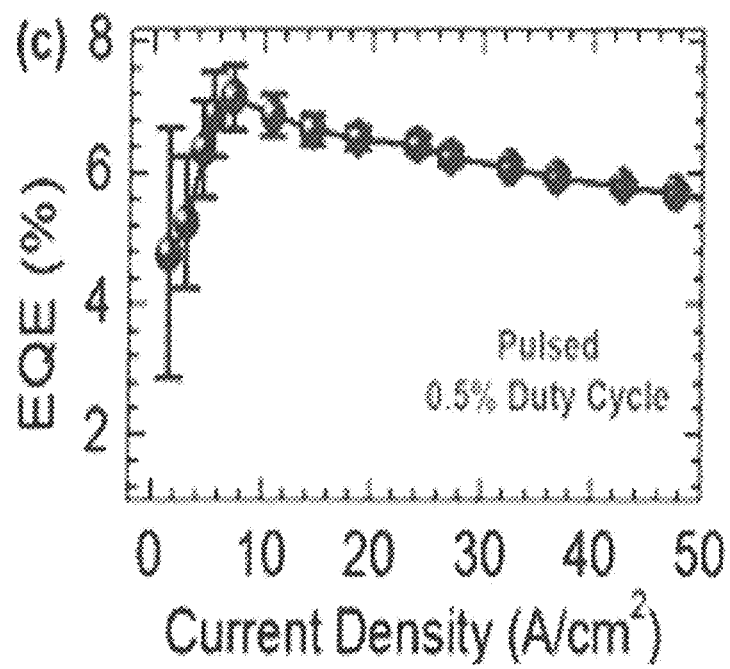
FIG. 15A is a block diagram showing the variation of EQE with injected current density under pulsed conditions in accordance with one embodiment.

To mitigate the heating effect, the device efficiencies were measured under pulsed conditions. FIG. 15A is a block diagram showing the variation of EQE with injected current density under pulsed conditions in accordance with one embodiment. The EQE of a tunnel junction deep UV LED is measured using pulsed bias with a 0.5% duty cycle. Error bars are provided.

Figure 15B:
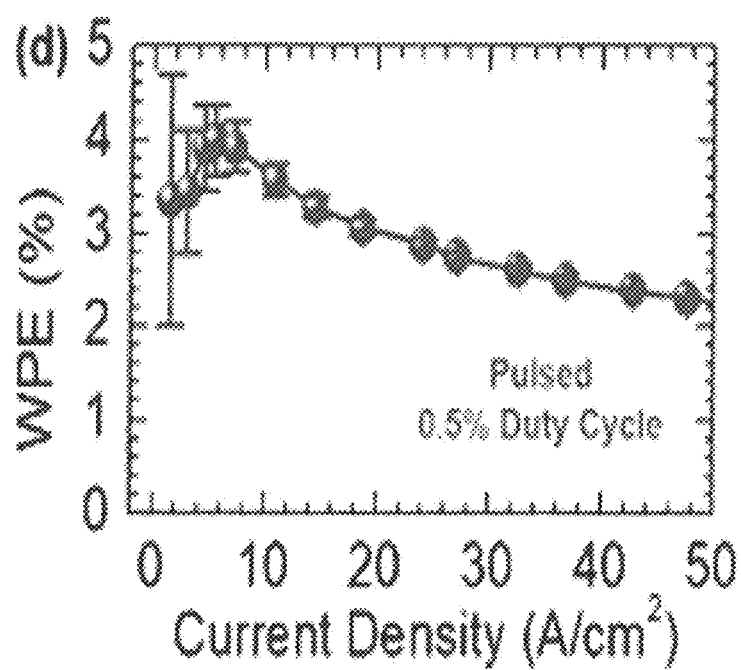
FIG. 15B is a block diagram showing the variation of WPE with injected current density under pulsed conditions in accordance with one embodiment.

FIG. 15B is a block diagram showing the variation of WPE with injected current density under pulsed conditions in accordance with one embodiment. The WPE is measured using the pulsed bias with a 0.5% duty cycle. Error bars are provided.

In one exemplary implementation, an AV-1010B pulse generator was used to bias the samples of FIGS. 15A and 15B with a 0.5% duty cycle. In one embodiment, a peak EQE of 7.2% and WPE of 4% were measured.

In one embodiment, despite the improved efficiency with reduced heating effect, the onset of efficiency droop is measured at a similar level of injection current as that under CW biasing conditions, suggesting that Joule heating may not be the primary cause for the efficiency droop. Recent studies have suggested that the primary cause for efficiency droop of deep UV LEDs is directly related to electron overflow. It is observed that there is a direct correlation between the onset current density of efficiency droop with the rapid broadening of the FWHM (e.g., shown in FIG. 13B), because of luminescence from recombination of overflowed electrons within the p-doped regions of the device. This observation is consistent with the hypothesis that the overflow of electrons from the active region is the primary cause of the efficiency droop, due to the highly asymmetric electron and hole transport of AlGaN.

Figure 16:
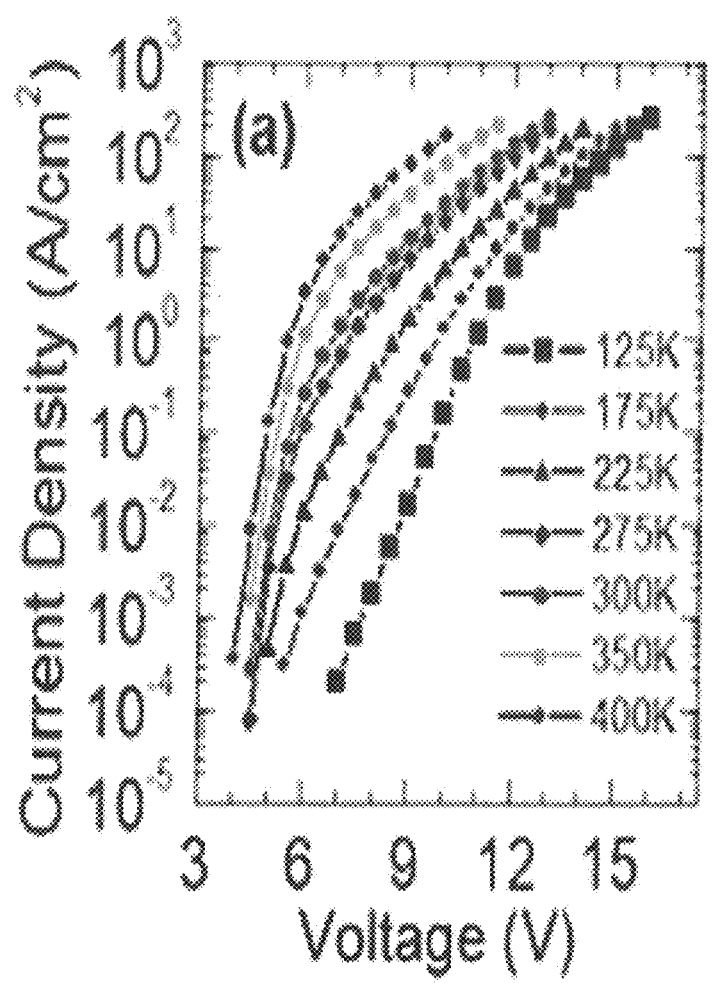
FIG. 16 is an illustration of a graph showing the current-voltage characteristics measured at different temperatures in accordance with one embodiment.

The device performance, including current-voltage and electroluminescence emission, was further measured in the temperature range of 100 to 400 K under CW biasing conditions. FIG. 16 is an illustration of a graph showing the current-voltage characteristics measured at different temperatures in accordance with one embodiment. The J-V characteristics are measured at different temperatures for a tunnel junction deep UV LED. The measured current at similar bias shows a significant increase with temperature. The device remains operational even at low temperatures, despite the high Mg acceptor ionization energy, which can be explained by the involvement of tunneling transport of holes in the depletion region. Recent studies suggest that the characteristic tunneling energy for hole transport is directly related to the Mg acceptor activation energy of Al(Ga)N and can be significantly reduced with enhanced Mg dopant incorporation, due to the Mg acceptor level dispersion at very high doping concentrations.

Figure 17:
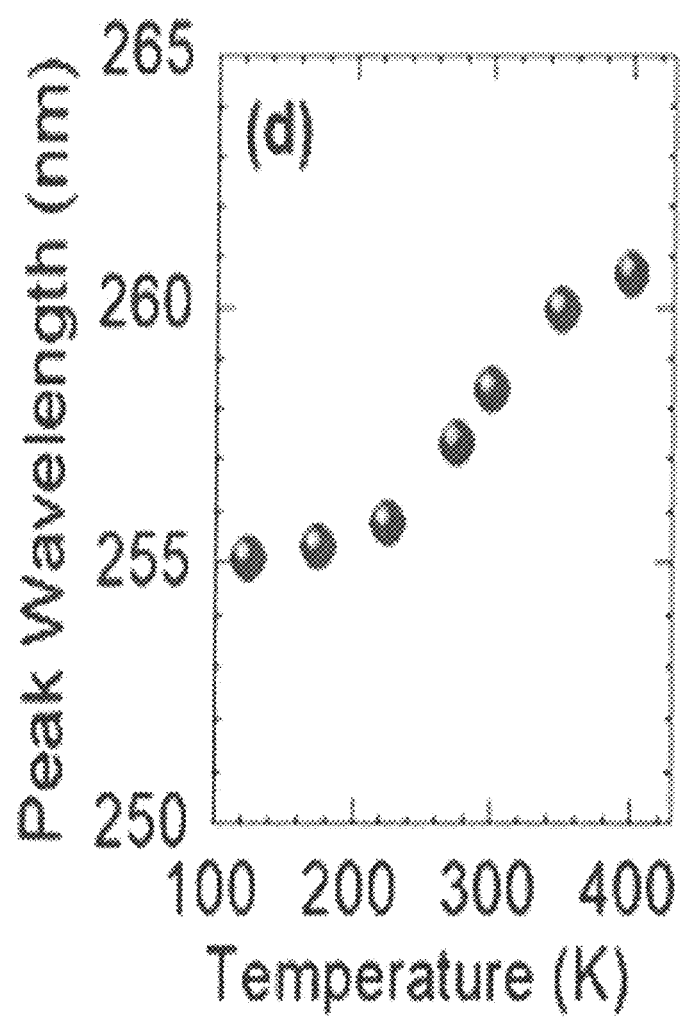
FIG. 17 is an illustration of a graph showing the inverse of the ideality factor plotted against temperature in accordance with one embodiment.
Figure 18:
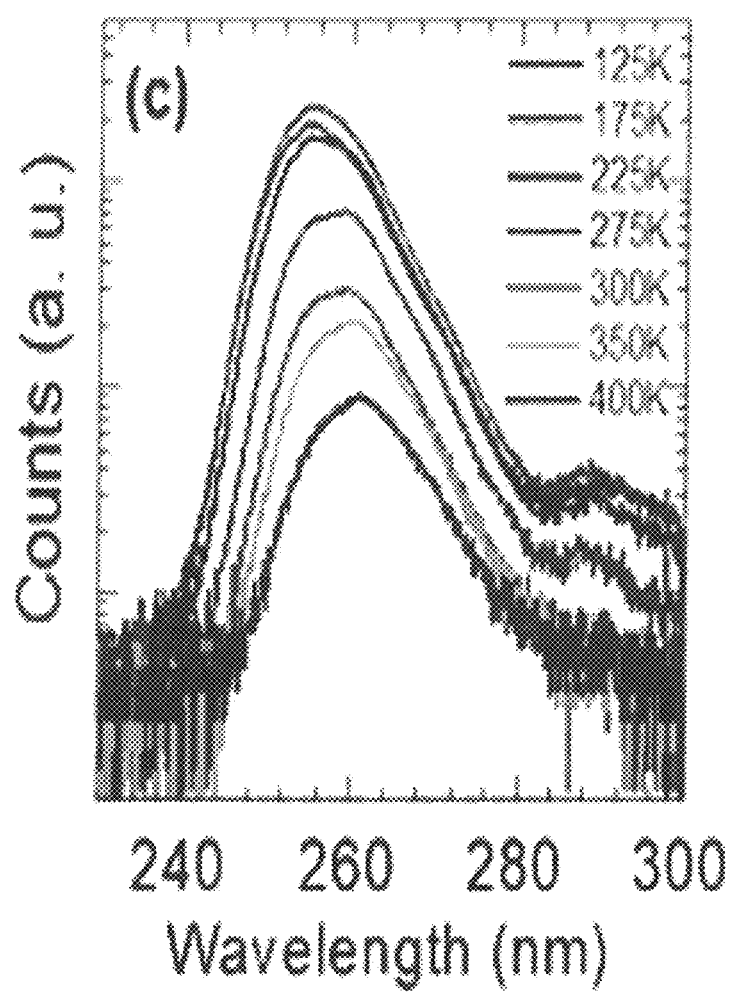
FIG. 18 is an exemplary graph showing the electroluminescence spectra in accordance with one embodiment.
Figure 19:
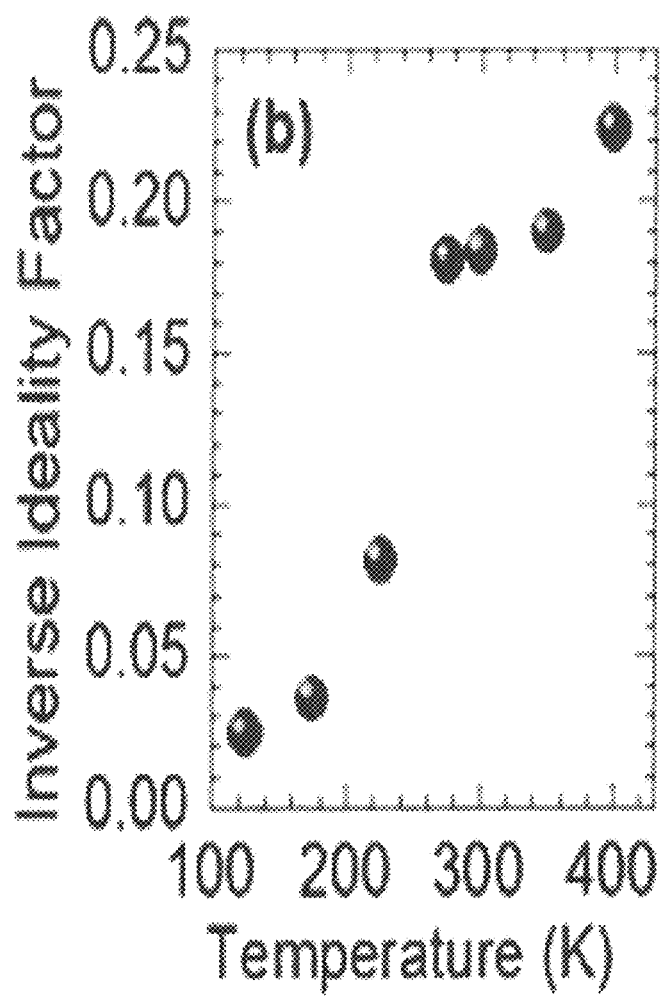
FIG. 19 is a graph illustrating exemplary peak position plotted in accordance with one embodiment.

At room temperature, the ideality factor is derived to be ~5.8, which is comparable to other III-nitride LEDs, in spite of the large bandgap and the presence of a tunnel junction. FIG. 17 is an illustration of a graph showing the inverse of the ideality factor plotted against temperature in accordance with one embodiment. The inverse of the ideality factor extracted from the J-V curves are plotted against temperature. A continuous decrease in the ideality factor is measured for the device as temperature is increased, which can be explained by the growing dominance of diffusion current in the depletion region with increasing temperature, due to the more efficient hole current injection. FIG. 18 is an exemplary graph showing the electroluminescence spectra in accordance with one embodiment. The electroluminescence spectra for a device are measured at different temperatures under the same injection current. The electroluminescence spectra were measured at different temperatures at a similar current density around 50 A/cm$^2$. FIG. 19 is a graph illustrating exemplary peak position plotted in accordance with one embodiment. The measurements include indications of variation in the peak emission wavelength with temperature. An expected blue shift is observed with decreasing temperature. The S-shaped temperature dependence of the curve is consistent with the presence of significant alloy disorder and nanoclusters as a result of the Ga-rich nanoclusters present in an active region (e.g., active region of FIG. 4, etc.). A small peak at ~290 nm is also observed. This can be explained by the increased internal quantum efficiency at low temperatures of the luminescence from overflowed carriers recombining within the p-doped region. At higher temperatures, this peak is too weak to detect. This observation confirms that the UV LEDs have severe electron overflow. Moreover, a sharp decrease in electroluminescence intensity was observed in the range of 225 K to 400 K, which illustrates the significance of carrier delocalization and thermal effects in inhibiting efficient radiative recombination. The decrease in electroluminescence at temperatures above room temperature exemplifies the importance in conducting heat away from the active region when devices are operated at high current densities for high-power applications.

In one embodiment, a high performance tunnel junction deep UV LEDs is implemented by using plasma-assisted MBE. The device operates at approximately 255 nm with a maximum EQE of 7.2% and WPE of 4%, which are nearly one to two orders of magnitude higher than previously reported tunnel junction devices operating at this wavelength. The device exhibits highly stable emission, with nearly constant emission peak with increasing current, due to the strong charge carrier confinement related to the presence of Ga-rich nanoclusters.

In one embodiment, a device suffered from efficiency droop at relatively low current densities. Detailed temperature-dependent measurements suggest that the presence of severe efficiency droop of deep UV LEDs is largely due to electron overflow. Furthermore, temperature-dependent measurements have shown the impact of thermal effects on the electrical and emission properties of the device. The device performance can be further improved with proper packaging and thermal management.

In one exemplary implementation, a device operates at approximately 255 nm light emission with a maximum external quantum efficiency (EPE) of 7.2% and wall-plug efficiency (WPE) of 4%, which are nearly one to two orders of magnitude higher than previously reported tunnel junction devices operating at this wavelength. The devices exhibit highly stable emission originating from highly localized carriers in Ga-rich regions formed in the active region, with nearly constant emission peak with increasing current density up to 200 A/cm$^2$, due to the strong charge carrier confinement related to the presence of nanoclusters (e.g., Ga-rich) and due to radiative emission originating from highly localized carriers in Ga-rich regions formed in the active region.

Thus, efficient and effective light emitting devices are presented. In one embodiment, high-performance tunnel junction deep ultraviolet (UV) light-emitting diodes (LEDs) are created using plasma-assisted molecular beam epitaxy. The device heterostructure is grown under slightly Ga-rich conditions to promote the formation of nanoscale clusters in the active region. The nanoscale clusters can act as charge containment configurations. In one embodiment, an active region comprises Ga(Al)N quantum well heterostructures with barrier layer thicknesses varying (e.g., decreasing, etc.) from a n-AlGaN side to a p-AlGaN side to enhance hole injection and transport. In one exemplary implementation the barrier layer thicknesses nanometers.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. An ultra-violet (UV) light emitting device comprising:
   a graded p-doped region, with a higher concentration of p-dopants towards one side of the p-doped region and a lower concentration of p-dopants towards an opposite side of the p-doped region;
   an active region, wherein at least two charge confinement structures within the active region are not uniform, wherein the active region includes quantum well heterostructures with barrier layer thicknesses varying from then-doped region to the p-doped region in a configuration that enhances hole injection and transport; and
   a n-doped region.

2. The UV light emitting device of claim 1, wherein the ultra-violet (UV) light emitting device is an ultra-violet (UV) light emitting diode (LED) device.

3. The UV light emitting device of claim 1, wherein then-doped region is a graded n-doped region with a higher concentration of n-dopants towards one side of the n-doped region and a lower concentration of n-dopants towards an opposite side of the n-doped region.

4. The UV light emitting device of claim 1, wherein the active region includes nanoclusters, wherein at least two of the nanoclusters are not uniform.

5. The UV light emitting device of claim 1, wherein the active region includes quantum dots, wherein at least two of the quantum dots are not uniform.

6. The UV light emitting device of claim 1, active region, is configured to emit light with a wavelength of approximately 210 nm to 260 nm.

7. The UV light emitting device of claim 1, wherein the active region, is configured to emit light with a wavelength of approximately 255 nm, plus or minus 5 nanometers.

8. The UV light emitting device of claim 1, wherein the graded p-doped region comprises p-AlGaN, the active region comprises AlGaN, and then-doped region comprises n-AlGaN.

9. The UV light emitting device of claim 1, further comprising a tunnel junction, wherein the tunnel junction includes a second p-doped region, an intermediate tunnel region, and a second n-doped region, wherein the second p-doped region and second n-doped region have different doping configurations than the graded p-doped region and graded n-doped region.

10. Method comprising:
    growing a contact region on a substrate;
    performing an active region formation process, wherein the active region includes a p-doped region graded down from approximately 90% to approximately 75% over approximately 20 nm and the active region includes non-uniform charge containment regions, and wherein the active region is coupled to the contact region; and
    creating a tunnel junction structure, wherein the tunnel junction structure is coupled to the contact region.

11. The method of claim 10, wherein the active region includes a light emitting material.

12. The method of claim 10, wherein the active region emits light in the ultra violet (UV) range.

13. The method of claim 10, wherein the active region emitting light in the 210 nm to 260 nm range.

14. A light emitting device comprising:
    a tunnel junction structure;
    a gradient p-doped layer;
    an active region including Ga(Al)N quantum well heterostructures with barrier layer thicknesses decreasing from a n-AlGaN to a p-AlGaN sides to enhance hole injection and transport, and
    an n-doped layer.

15. The light emitting device of claim 14, wherein the active region includes a nonuniform charge containment region.

16. The light emitting device of claim 14, wherein the gradient p-doped layer, the tunnel junction structure, the active region, and the gradient n-doped layer are configured to emit light with a wavelength of approximately 210 nm to 260 nm.

17. The light emitting device of claim 14, wherein the light emitting device exhibits highly stable light emission at approximately 255 nm with virtually no change in peak emission for injection current densities up to 200 A/cm$^3$.

18. The light emitting device of claim 14, wherein the gradient p-doped layer, the tunnel junction structure, the active region, and the gradient n-doped layer are configured to emit light with an external quantum efficiency (EQE) of greater than 5% with a wavelength of less than 260 nm.

19. The light emitting device of claim 14, wherein the gradient p-doped layer, the tunnel junction structure, the active region, and the gradient n-doped layer are configured to have a wall plug efficiency WPE of more than 4%.

20. The light emitting LED device of claim 14, wherein the wherein the light emitting device is a light emitting diode (LED) device wherein:
    the n-doped region includes:
    a bottom n-$Al_{0.75}Ga_{0.25}N$ contact layer;
    a layer wherein the n-AlGaN is graded up from 75% Al composition to 90%;
    the active region includes quantum wells with decreasing barrier widths;

the gradient p-doped layer includes a p-doped AlGaN electron blocking layer (EBL), with Al composition graded down from 90% to 75%; and the tunnel junction structure includes:
- a highly doped p-$Al_{0.75}Ga_{0.25}N$ layer;
- a GaN layer; and
- a heavily doped n-$Al_{0.75}Ga_{0.25}N$ top contact layer.

21. The light emitting device of claim 14, wherein the gradient p-doped layer, the tunnel junction structure, the active region, and the gradient n-doped layer are configured to have a current rectification ratio of greater than 10 to the 7th at 10 Volts, plus or minus 1 volt.

* * * * *